United States Patent [19]
Kawakami et al.

[11] Patent Number: 5,650,007
[45] Date of Patent: Jul. 22, 1997

[54] METHOD FOR PRODUCTION OF SPINEL SINGLE CRYSTAL FILAMENTS

[75] Inventors: Shoji Kawakami, Nagoya; Hideyo Tabata, Kasugai; Toyoaki Yamada, Owari-Asahi; Shunsaku Sakakibara, Nagoya, all of Japan

[73] Assignee: Agency of Industrial Science & Technology, Ministry of International Trade & Industry, Tokyo, Japan

[21] Appl. No.: 612,804

[22] Filed: Mar. 11, 1996

[30] Foreign Application Priority Data

May 19, 1995 [JP] Japan .................................... 7-145541

[51] Int. Cl.⁶ .................................................. C30B 21/04
[52] U.S. Cl. ........................... 117/75; 117/2; 117/921; 117/937
[58] Field of Search .................... 117/2, 3, 937, 117/75, 921; 428/446

[56] References Cited

U.S. PATENT DOCUMENTS 3,658,586  4/1972  Wang ................................. 437/1
3,883,313  5/1975  Cullen et al. ..................... 23/301.8
4,177,321  12/1979  Nishizawa ........................ 428/446

OTHER PUBLICATIONS

J. Sigalovsky, et al., "Growth of Spinel Single Crystal Fibers by the Laser-heated Floating-zone Technique and their Characterization as *High Temperature Reinforcements*", Journal of Crystal Growth 134, (pp. 313-324), 1993.

*Primary Examiner*—R. Bruce Breneman
*Assistant Examiner*—Felisa Garrett
*Attorney, Agent, or Firm*—Oblon, Spivak, McClelland, Maier & Neustadt, P.C.

[57] ABSTRACT

Spinel single crystal filaments are produced by a method which consists essentially of solidifying in one direction a melt consisting essentially of 30 to 70% by weight of magnesium oxide, 10 to 45% by weight of aluminum oxide, and 15 to 45% by weight of silicon dioxide, thereby forming a composite texture containing a matrix of forsterite and filaments of spinel dispersed in the matrix, and then separating the filaments of spinel from the composite texture.

4 Claims, No Drawings

METHOD FOR PRODUCTION OF SPINEL SINGLE CRYSTAL FILAMENTS

BACKGROUND OF THE INVENTION

1. Field of the Invention

This invention relates to a method for the production of spinel single crystal filaments which are excellent in heat-resistance, anti-corrosion, mechanical strength, etc. and are useful as high-temperature heat insulators and fiber-reinforcing filaments. More particularly, this invention relates to a method which enables spinel single crystal filaments measuring not more than several μm in diameter and suitable for a wide variety of applications to be produced expeditiously with high productivity in a large quantity in one operation.

2. Prior Art Statement

The manufacture of a ceramic material into filaments can be attained by such methods as the sol-gel method. The filaments which are produced by these methods are polycrystals and, therefore, are liable to be deteriorated by the growth of grains at elevated temperatures. They are moreover inferior to single crystal filaments in such properties as mechanical strength. Numerous methods for producing single crystal filaments of ceramic materials have therefore been developed to date.

As regards spinel ($MgAl_2O_4$), it is a known practice to produce single crystal filaments of this ceramic material by the laser heat floating zone method (J. Sigalovsky et al.,: J. Crystal Growth Vol. 134, p 313, 1993). This method, developed by scaling down the floating zone method normally used for growing single crystals measuring several mm in diameter, is adapted for growth of extremely thin single crystals from extremely thin raw material rods.

The laser heat floating zone method is deficient in productivity, however, and is capable of producing only one filament per operation. Further, this method cannot easily produce thin filaments measuring less than some tens of μm in diameter. The filaments therefore have practical utility only in limited applications.

SUMMARY OF THE INVENTION

In the light of these shortcomings of the prior art, the present inventors pursued studies with the object of developing a novel method for the production of spinel single crystal filaments which enables spinel single crystal filaments measuring less than several μm in diameter and suitable in a wide variety of applications to be produced with high productivity in a large quantity in one operation. As a result, they have found that this object can be achieved by preparing a melt containing an eutectic composed of a specific ratio of spinel and forsterite and cooling the melt in such a manner that its solidification proceeds in said eutectic and its vicinity in one direction. This invention has been perfected as a result.

To be specific, this invention is directed to enabling spinel single crystal filaments having a thickness of not more than several μm and suiting a wide variety of applications to be produced in a large quantity in one operation.

Another object of this invention to provide a method for producing spinel single crystal filaments having a thickness of not more than several μm and a length of not less than some tens of μm, which are excellent in heat-resistance, anti-corrosion, and mechanical strength and useful as high-temperature heat insulators and fiber-reinforcing filaments.

This invention relates to a method for the production of single crystal filaments of spinel, consisting essentially of preparing a melt consisting essentially of 30 to 70% by weight of magnesium oxide (MgO), 10 to 45% by weight of aluminum oxide ($Al_2O_3$), and 15 to 45% by weight of silicon dioxide ($SiO_2$), cooling the melt so as to solidify at least part thereof in one direction, thereby forming a composite texture consisting of a matrix of forsterite $Mg_2SiO_4$) and filaments of spinel dispersed in the matrix, and separating the spinel filaments from the composite texture.

DESCRIPTION OF THE PREFERRED EMBODIMENTS

This invention forms a solidified substance having a composite texture consisting of a filament dispersed phase of spinel and a matrix of forsterite by a process such as unidirectional solidification and obtains spinel single crystal filaments by removing the forsterite from the solidified substance by a process such as dissolution.

In a binary composition forming an eutectic, when the melt of the eutectic and portions in the vicinity thereof are cooled and solidified in such a manner that the solidification proceeds in one direction, one phase of the binary composition is transformed into numerous minute filamentous single crystals as dispersed in the other phase. The present inventors focused their attention on applying this phenomenon to the manufacture of spinel single crystal filaments. Through their studies to this end they found that an eutectic of spinel and forsterite suits the objects of this invention.

The melt which is solidified in one direction in the method of this invention consists essentially of 30 to 70% by weight of magnesium oxide, 10 to 45% by weight of aluminum oxide, and 15 to 45% by weight of silicon dioxide. The invention does not particularly specify the raw materials to be used for preparing the melt insofar as they provide the aforesaid composition. Generally, a mixture of powdered oxides, hydroxides, carbonates, etc. of magnesium, aluminum, and silicon is used. Other raw materials are usable instead so long as they are capable of reacting with one another and forming the composition containing an eutectic composed of spinel and forsterite mentioned above during the heating and melting steps. When the raw materials are added with suitable elements such as chromium, nickel, iron, and manganese, the spinel filaments which they ultimately form have these elements in the form of a solid solution therewith. Thus, this invention allows addition of suitable elements to the raw materials as occasion demands.

Though the unidirectional solidification of a binary composition is normally implemented in the eutectic composition portions thereof, it can also be achieved in binary composition portions apart from the eutectic composition. In order for this invention to obtain the composite texture appropriately, the composition at the time of solidification is required to have a magnesium oxide content in the range of 30 to 70% by weight, an aluminum oxide content in the range of 10 to 45% by weight, and a silicon dioxide content in the range of 15 to 45% by weight. Preferably, the composition in this range is such that the solidification thereof results in precipitating spinel and forsterite in a total of not less than 80% by weight. This is because the appropriateness of the solidification in terms of the yield of spinel filaments is better when the solidification avoids precipitating a phase other than spinel and forsterite in a very large quantity. The optimum composition at the time of solidification is the eutectic composition of spinel and forsterite, namely the combination of 49% by weight of magnesium oxide, 21% by weight of aluminum oxide, and 30% by weight of silicon dioxide. To produce a preferable composite texture, it is desirable to use the melt of the eutectic composition mentioned above. However, the use of this melt is not critical. For this invention, a melt which approximates the eutectic composition mentioned above may be suitably used.

When the above said composition is heated and melted and the resultant melt is cooled at a proper speed for solidifying it in one direction, a composite texture containing elongated spinel single crystal filaments is produced. While various well-known methods such as the floating zone method, the Bridgeman method, and the Bernoulli method are available as means for melting raw materials and solidifying the resultant melt in one direction, the invention is not limited to these and can use any method for melting and solidifying the raw materials. This invention does not require the entire melt to be solidified in one direction. The unidirectional solidification which occurs in a relatively small area of the melt suffices to obtain the product aimed at by this invention. For the purpose of obtaining filaments having a maximum length of 1 mm, for example, the area in which the unidirectional solidification occurs has only to be at least 1 mm in length. The whole solid may be composed of an aggregate of such areas.

A composite texture meeting the quality requirement of this invention can therefore be produced even by a method which is not generally accepted as a means capable of unidirectional solidification such as, for example, the skull melt method which is used for the production of a single crystal by solidification of a melt or the method which comprises placing a melt in a crucible and gradually cooling the melt at a suitable temperature distribution.

Spinel single crystal filaments can be obtained by removing from the composite texture the forsterite constituting the matrix of the composite texture. Any method can be adopted for the removal of forsterite insofar as it does not seriously damage the spinel. The removal can be achieved easily by dissolving or decomposing the forsterite with a suitable acid or alkali, such as hydrochloric acid, nitric acid, fluorine or an aqueous sodium hydroxide solution, or with a fused salt such as sodium carbonate or sodium chloride. One specific method appropriate for the removal is that of decomposing the forsterite with hydrochloric acid, thereby converting it into an amorphous phase, and then dissolving the amorphous phase with an aqueous sodium hydroxide solution. The spinel single crystal filaments are obtained by washing and drying the results.

By the procedure described above, relatively thin spinel single crystal filaments measuring not more than several μm in diameter and not less than some tens of μm in length, more specifically 0.1 to 10 μm in diameter and 10 μm to 10 mm in length, can be obtained in large numbers, for example, more than one billion in one operation.

Methods for unidirectionally solidifying a melt are known to the art. None of these methods, however, has been viewed in association with the manufacture of spinel single crystal filaments. Neither cases of applying such methods to the manufacture of spinel single crystal filaments nor cases of studying these methods in connection with the characteristic properties of spinel single crystal filaments are known to the art.

As described above, this invention relates to a method for the production of spinel single crystal filaments which is characterized by solidifying in one direction portions of a melt of a composition that is the eutectic of spinel and forsterite and portions in the vicinity of such portions, thereby forming a composite texture having the spinel in the form of a filamentous disperse phase and the forsterite in the form of a matrix, and removing the matrix of forsterite by dissolution and consequently obtaining the spinel single crystal filaments. When the melt approximating the eutectic composition of spinel and forsterite is cooled and solidified at a suitable rate in such a manner that the solidification proceeds in one direction, there is formed a composite texture in which the disperse phase of spinel as one component of the composition is converted into numerous minute filamentous single crystals and dispersed in the matrix phase of forsterite as the other component of the composition. From this composite texture, the spinel single crystal filaments can be obtained by removing the forsterite constituting the matrix. By the present invention, the spinel single crystal filaments can be produced in a large quantity in one operation.

EXAMPLES

This invention will now be described more specifically with reference to working examples. It should be noted that this invention is not limited to or by these working examples in any sense.

Example 1

1) Preparation of raw material containing eutectic composition

Powders of magnesium hydroxide, aluminum oxide, and silicon dioxide were mixed. The mixed powder was calcined at 750° C. About 3 g of the calcined mixed powder was compression molded into a rod about 6 mm in diameter and sintered at 1300° C. The sintered rod thus obtained was found to be composed of 49% by weight of magnesium oxide, 21% by weight of aluminum oxide, and 30% by weight of silicon dioxide.

2) Solidification of melt

This sintered rod was set in an infrared concentrated heating device for manufacture of a single crystal. By a procedure similar to that for the growth of a single crystal by the ordinary floating zone method, the melting zone was moved along the length of the sintered rod from one end thereof at the rate of 120 mm per hour. As a result, the sintered rod was once melted and then solidified in one direction and converted into a solidified rod about 4 mm in diameter. This solidified rod was formed of a composite texture comprising a spinel phase and a forsterite phase (with a trace phase of impurities) and having the spinel in the form of a filamentous disperse phase and the forsterite in the form of a matrix.

The spinel phase accounted for 30% by weight and the forsterite phase for 70% by weight of the composite texture.

3) Removal of matrix

The solidified rod was ground into particles about 1 mm in diameter in a mortar. The particles and concentrated hydrochloric acid added thereto in an amount of about 30 ml per g of the particles were maintained at about 90° C. for 24 hours. The particles were then removed of the hydrochloric acid and washed with water. By this time, the sample was composed of a spinel phase and an amorphous phase. This fact indicates that the forsterite phase had been decomposed and converted into the amorphous phase. Subsequently, the sample and an aqueous 25 wt % sodium hydroxide solution added thereto in an amount of about 30 ml per g of the sample were maintained at about 90° C. for 24 hours to dissolve the amorphous phase. When the resultant sample was washed with water and dried, spinel single crystal filaments measuring 0.2 to 2 µm in diameter and 50 µm to 1 mm in length were obtained. From the density of the spinel filaments distributed in the composite texture, it is estimated that the steps explained above produced not less than one billion single crystal filaments of spinel.

Example 2

A solidified rod was prepared by following the procedure of Example 1 except that the rate of movement of the melting zone was set at 15 mm per hour. The solidified rod in its whole form was placed in concentrated hydrochloric acid and maintained therein at about 90° C. for 12 hours. It was then heated in an aqueous 25 wt % sodium hydroxide solution at about 90° C. for 18 hours. The heated rod was washed with water and dried. As a result, the matrix was removed from the rod to a depth of about 0.2 mm from the surface and spinel single crystal filaments about 2 µm in thickness and about 3 mm in maximum length were obtained.

Example 3

A solidified rod was prepared by following the procedure of Example 1 except that the rate of movement of the melting zone was set at 6 mm per hour and the rod was composed of 51% by weight of magnesium oxide, 21% by weight of aluminum oxide, and 28% by weight of silicon dioxide. This solidified rod comprised a spinel phase and a forsterite phase plus a trace of impurities.

This solidified rod, which was composed of 34% by weight of the spinel phase and 66% by weight of the forsterite phase, was sliced into disks about 2 mm in thickness. The disks were left standing at rest in a liquid prepared by mixing concentrated hydrochloric acid and concentrated hydrofluoric acid at a volumetric ratio of 10:1 at normal room temperature for four months. When the disks were removed from the liquid, washed with water, and dried, they were readily disintegrated into spinel single crystal filaments measuring about 5 µm in thickness and about 0.2 mm in length.

We claim:

1. A method for the production of spinel single crystal filaments, consisting essentially of preparing a melt consisting essentially of 30 to 70% by weight of magnesium oxide, 10 to 45% by weight of aluminum oxide, and 15 to 45% by weight of silicon dioxide, cooling and solidifying said melt in such a manner that the solidification of at least part of said melt proceeds in one direction, thereby forming a composite texture containing a matrix of forsterite and filaments of spinel dispersed in said matrix, and separating said filaments of spinel from said composite texture.

2. The method according to claim 1, wherein said composite texture contains forsterite and spinel in a total of at least 80% by weight.

3. The method according to claim 1, wherein said melt is composed of 49% by weight of magnesium oxide, 21% by weight of aluminum oxide, and 30% by weight of silicon dioxide.

4. The method according to claim 1, wherein said spinel single crystal filaments have a maximum diameter of 10 µm and a minimum length of 10 µm.

* * * * *